United States Patent [19]
Caron et al.

[11] Patent Number: 5,997,983
[45] Date of Patent: Dec. 7, 1999

[54] RIGID/FLEX PRINTED CIRCUIT BOARD USING ANGLED PREPREG

[75] Inventors: A. Roland Caron; Sandra L. Jean, both of Hudson; James E. Keating, Litchfiled; Robert S. Larmouth, Londonderry; Lee J. Millette, Litchfield, all of N.H.

[73] Assignee: TeledyneIndustries, Inc., Los Angeles, Calif.

[21] Appl. No.: 08/865,888

[22] Filed: May 30, 1997

[51] Int. Cl.$^6$ .............................. H05K 1/00; B32B 3/00
[52] U.S. Cl. .................... 428/105; 428/209; 428/901; 442/228; 442/232; 174/254
[58] Field of Search .................... 442/378, 228, 442/232; 428/209, 901, 902, 105; 174/254

[56] References Cited

U.S. PATENT DOCUMENTS

| | | |
|---|---|---|
| 3,264,524 | 8/1966 | Dahlgren et al. . |
| 3,409,732 | 11/1968 | Dahlgren et al. .................... 174/68.5 |
| 4,035,694 | 7/1977 | Barton et al. ............................ 442/378 |
| 4,191,800 | 3/1980 | Holtzman ................................ 442/378 |
| 4,368,234 | 1/1983 | Palmer et al. ........................... 428/902 |
| 4,446,173 | 5/1984 | Barrell et al. ........................... 442/378 |
| 4,446,191 | 5/1984 | Miyadera et al. ....................... 442/373 |
| 4,550,051 | 10/1985 | Spielan et al. ........................... 442/378 |
| 4,622,254 | 11/1986 | Nishimura et al. ..................... 428/902 |
| 4,800,461 | 1/1989 | Dixon et al. ............................. 361/398 |
| 4,883,700 | 11/1989 | Harpell et al. .......................... 428/113 |
| 4,927,581 | 5/1990 | Medwin .................................. 264/108 |
| 5,004,639 | 4/1991 | Desai ...................................... 428/138 |
| 5,017,312 | 5/1991 | Peters et al. ............................. 264/24 |
| 5,114,775 | 5/1992 | Gsell et al. .............................. 428/107 |
| 5,121,297 | 6/1992 | Haas ........................................ 174/255 |
| 5,144,742 | 9/1992 | Lucas et al. .............................. 29/830 |
| 5,200,246 | 4/1993 | Sabee ...................................... 428/109 |
| 5,273,819 | 12/1993 | Jex .......................................... 428/297 |
| 5,275,877 | 1/1994 | Isayev .................................... 428/294 |
| 5,499,444 | 3/1996 | Doane, Jr. et al. ....................... 29/830 |

FOREIGN PATENT DOCUMENTS

| | | | |
|---|---|---|---|
| 61-42992 | 3/1986 | Japan .............................. H05K 3/18 |
| 5-131582 | 5/1993 | Japan .............................. B32B 5/12 |
| 9-036499 | 2/1997 | Japan .............................. H05K 1/02 |

OTHER PUBLICATIONS

"Flexural Fatigue and Ductility, Flexible Printed Wiring" IPC; "IPC–TM–650 Test Methods Manual"; Mar. 1991; pp. 1–3.

The Institute for Interconnecting and Packaging Electronic Circuits IPC; "IPC–TM–650 Test Methods Manual—Adhesion, Solder Mask Flexible Circuits"; Jan. 1996; pp. 1, 5–6.

The Institute for Interconnecting and Packaging Electronic Circuits Thatcher et al; "High Resolution Photoimageable Covercoats for Flex Applications"; pp. 1–15; Coates Circuit Products.

*Primary Examiner*—Deborah Jones
*Assistant Examiner*—Cathy F. Lam
*Attorney, Agent, or Firm*—Hayes Soloway Hennessey Grossman & Hage PC

[57] ABSTRACT

A rigid flex printed circuit board wherein the flex section of said board comprises a basestock composite with edges formed by laminating a conductive layer to a flexible insulator layer, the conductor layer containing at least one conductive pathway and the flexible insulator layer comprises fibers dispersed in a matrix polymer. The fibers are oriented with respect to the conductive pathway so that the conductive pathway is substantially non-aligned with said fibers, substantially along an entirety of the conductive pathway in the flex section so as to be flexible.

14 Claims, 4 Drawing Sheets

RIGID/FLEX PRINTED CIRCUIT BOARD USING ANGLED PREPREG

FIELD OF THE INVENTION

The present invention relates to the fabrication of a rigid/flex printed circuit board wherein the construction technique involves the use of prepreg sheet in novel configuration wherein the weave fibers are positioned relative to the conductive pathways to increase the flexing characteristics of the flexible section during bending. Furthermore, the present invention relates to a method of fabrication which eliminates the need of additional process steps and/or materials to fabricate the flexible innerlayers as is required using prior art construction techniques.

BACKGROUND OF THE INVENTION

A review of the prior art which is pertinent to the present invention considers two general areas. The first of these is that prior art which deals with the manufacture of rigid-flex circuit boards. This is followed by a review of the prior art relating to prepreg materials used in the manufacture of laminated structural components.

Techniques for making multilayer rigid flex printed circuit boards are well known in the field. One early example of the prior art is disclosed in U.S. Pat. No. 3,409,732 assigned to the assignee of the present application. Typically, a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

Typically, and as disclosed in detail in U.S. Pat. No. 4,800,461, also assigned to the assignee of the present invention, in the construction of a multilayer rigid flex circuit board, the initial processing step includes formation of a basestock by laminating two copper sheets to an insulator layer comprising one or two fiberglass sheets impregnated with an adhesive such as an epoxy, commonly referred to as a prepreg. Following lamination, the copper layers can be imaged and etched to provide copper pads and conductors. The exposed copper conductor patterns are then treated to enhance bondability of an epoxy prepreg to the copper. Then, two additional insulator prepreg sheets having cutouts are positioned on both sides of the base stock. A flexible insulator of Kapton (polyimide) covered with a suitable adhesive which provides bonding to copper is positioned on both sides of the cutout section. In addition, the Kapton sheets are slightly longer than the cutout sections in the glass layers to overlap by, for example. 0.050 inch. The sandwich formed by the foregoing sheets is then laminated together to provide a rigid flex board, wherein the Kapton provides excellent flexibility and tear resistance characteristics to the flex section.

Of additional general background interest, attention is directed to U.S. Pat. No. 5,499,444, entitled "Method of Manufacturing a Rigid Flex Printed Circuit Board". In said patent, it is reported the fabrication of multilayer boards with the above referenced materials has led to some persistent problems. First, alignment of circuitry at different layers in the board is critical, and provisions must be made to prevent sliding of any layers in different planes with respect to other planes by more than a tolerance of a few thousandths of an inch. Maintaining registration of the flexible portion has also been a serious problem since the hard board must be cured or laminated by a heat-press process that is likely to cause interlayer slippage as well as thermal dimensional changes. Other problems are encountered due to the thermal expansion of the typically used insulator materials such as acrylic adhesive and the polyimide film utilized in the construction ol the rigid flex boards. Thus, failures occur when the board is subjected to elevated temperatures in thermal stress testing, hot oil solder reflow, and the like.

Another difficulty with the use of dielectric films such as Kapton film in the rigid board area is their absorption of excessive moisture, on the order of up to 3 percent by weight of water. Absorbed moisture in the circuitry with no means of escape, may cause unacceptable delamination in the rigid board area when it volatilizes during fabrication or during subsequent high temperature operation. This effect may be more destructive than simple mismatch of thermal coefficients.

The foregoing problems have in one form or another been addressed in the prior art, as shown for example in U.S. Pat. No. 4,800,641; U.S. Pat. No. 5,144,742 and U.S. Pat. No. 5,004,639. Approaches in addressing one or more of the problems involve such construction techniques as adding pads in non functional layers of the plated through holes, utilizing a curable liquid dielectric for certain layers orf layers; using temporary sheet patches of filler material surrounding(y flex regions during a heat pressing assembly stage to maintain alignment; adding glass fiber reinforcement of the flex layer for strengthening; and finally, a number of other changes or addition to the manufacturing process. However each of these solutions entails additional steps to address any one problem, and may have adverse consequences on another apparently unrelated problem. For example, the switch to acrylic cements and a polyimide flexible film has been largely responsible for moisture absorption and failure of plated through holes in multilayer boards at high temperatures. Reducing the size of the polyimide/acrylic components to limit thermal stress introduces boundary problems where flexible and rigid elements are patched together. Furthermore many of these improvements require more detailed manufacturing steps that can be costly as well as time consuming.

In U.S. Pat. No. 5,499,444, a rigid flex printed circuit board is prepared via a process wherein each circuit layer is punched in the peripheral regions with alignment slots and all layers are assembled without any acrylic bonding in a single hot press operation. More specifically, a central layer is formed of a sheet of epoxy/glass material with top and bottom copper foil layers. This central layer is cured and punched with slots at its edge, of which a portion thereof ultimately provides formation of the flexible portion of the finished board. The slots allow motion along only one of two orthogonal axis, and subsequently the punched layers (with windows for formation of the flexible region) and the central portion are assembled in a single press curing operation in which process-induced motions and realignments are constrained to occur with a small magnitude that varies with the radial position along an alignment rosette centered on the board. A top or final cover layer extends over both the flexible and rigid regions to further assure uniform alignment at all levels during pressure assembly. The '444 patent emphasizes that by using a glass/epoxy layer for the central flexible portion instead of some form of polyimide or other material, an all glass construction is achieved that is free of the major problem of z-axis thermal stresses of the conventional polyimide-glass construction. Furthermore, it is mentioned that on top of the copper layer in the flex section is a cover of insulating material which may be an adhesively bonded plastic film or a coated-on film, such as a conformal cover coat known in the art, suitable of which is a solder mask such as a UV curable flexible solder resist or a heat curable preparation both of which can be applied by a screening operation. This cover material is then described as being cured before assembly with subsequent layers.

In U.S. Pat. No. 5,144,742 there is disclosed a rigid flex printed circuit board fabricated by the steps of first forming circuitry components on a rigid flex subassembly including laminated conductive layers on opposite sides of a central insulating layer. This is followed by depositing a liquid precursor of flexible insulating layers over the circuitry components in portions of the printed circuit board subassembly corresponding to the flexible section in the final rigid flex board. The liquid precursor is then cured to form an insulating layer as a protective coating over the circuitry components in the flexible section, which is followed by finally laminating a plurality of components including at least one rigid flex subassembly and rigidizing insulating layers to form a rigid flex printed circuit board.

Attention is next directed to "High Resolution Photoimageable Covercoats for Flex Applications", a paper presented at "Flexcon 95" by W. J. Thatcher and P. M. Banks. As disclosed therein, the product sold under the tradename Imageflex™ has become available, and is characterized as a thermal hardening two/pack two component liquid photoimageable flexible soldermask that dries by evaporation to give an aqueous processable film with a gloss or matt finish. It is mentioned therein that Imageflex™ has proven suitable in a variety of flexible circuit application. The Imageflex™ is said to offer significant advantages for the product of many types of flexible printed circuits, and as an alternative to polyimide coverlay, Imageflex™ offers lower cost and higher feature resolution and alignment accuracy. In addition, a photoimageable solder mask is now available from Taiyo, Japan.

In U.S. patent application Ser. No. 08/800,844 filed Feb. 14, 1997, entitled "Multilayer Combined Rigid/Flex Printed Circuit Board", and which is assigned to the present assignee, whose teachings and prior art cited therein are incorporated by reference, there is disclosed a multilayer rigid flex printed circuit board wherein the board laminate comprises a basestock composite containing a flexible core, formed by laminating a first conductive layer to a flexible insulator layer, along with a second insulator layer affixed to the basestock, said second insulator layer having a cutout region proximate to the flexible core of the basestock composite to expose a portion of said first conducting layer on said flexible core, and a second conductive layer also having a cutout region proximate to the flexible core of the basestock composite. A photo-imageable soldermask is then applied to said exposed portion of said first conductive layer, and to the second conductive layer, wherein said photoimageable soldermask allows for photo definition of openings upon the conductive layers upon which it is applied.

Finally, attention is also directed to U.S. application Ser. No. 08/702,729, filed Sep. 6, 1996, also assigned to the present assignee, whose teachings and prior art cited therein are incorporated by references which discloses a multilayer rigid flex printed circuit board, wherein the board laminate comprises a double-sided basestock composite, formed by laminating two conducting sheets to an insulating layer, said insulator layer containing a flexible core, a second insulator layer affixed to each side of the basestock. said insulator having a cutout region proximate to the flexible core of the basestock composite, a flexible layer affixed to said cutout regions with an adhesive, wherein said flexible layer contacts the conducting layers and abuts and overlaps a portion of the second insulator layer such that upon stacking of the board laminate a hollow region is produced as between the stacked laminate sections.

Accordingly, as can be seen from the above review of the prior art, in the case of manufacturing, a rigid flex printed circuit board, there has been an on-going effort to develop the most efficient and cost effective manufacturing process to address the various problems in the art, and in particular, the problem of combining dissimilar materials to provide rigid-flex characteristics. In other words, until now, prepreg material has been used almost exclusively for the manufacture of the rigid section, and something other than prepreg, e.g., a polyimide, has been employed for manufacture of the flex section. and as a consequence, a truly low cost rigid-flex circuit has not yet been available to the industry.

Of course, with regards to prepreg material itself, a fair amount of art has been established regarding the use of prepreg material for basic structural applications, well outside the scope of rigid flex circuitry. Nevertheless, and as noted at the outset, a review of such technology is still in order.

For example, in U.S. Pat. No. 4,927,581, there is disclosed a method of shaping elongated composite structures of a resin matrix reinforced with randomly broken fibers oriented in transverse and non-transverse directions with respect to the longitudinal axis of the structure. The formed structure is said to be characterized by the particular orientation of the fibers in the transverse and non-transverse direction after the structure is formed.

In U.S. Pat. No. 5,017,312 there is disclosed an apparatus for the manufacture of oriented chopped glass fiber mats from non-conductive fiber feed stock. A preferred embodiment includes the incorporation of a glass fiber mat into a composite by applying a matrix resin to the mat in sufficient quantity to ensure the integrity of the mats. The process for manufacturing non-woven oriented mats is also disclosed.

In U.S. Pat. No. 5,200,246 there is disclosed a low-cost, high web integrity fabric that can be economically produced and tailored to provide a variety of different combinations of characteristics and properties for different end uses. The fabric is described as containing continuous filaments, ranging from elastomeric to non-elastic. but elongatable to some minimum extent, for strength and elasticity.

In U.S. Pat. No. 5,273,819 there is disclosed an improved ram extruded composite product. A composite is said to be formed from a phenolic resin, containing carbon fibers of various lengths where each length of fibers are oriented in a pre-selected, pre-determined orientation.

In U.S. Pat. No. 5,275,877 there is disclosed a shaped reinforced thermoplastic composite. The composite is formed by forming a prepreg as a plurality of individual sheets or layers which comprises essentially unidirectionally oriented fibers. A lay-up is formed by curing each individual sheet or layer into pieces so that the direction of fiber orientation in each such piece is either parallel to one pair of edges or at angles of 45 degrees to all of the edges.

It is therefore an object of the present invention to advance further over the prior art reviewed above and provide what is considered to be one of the most cost effective routes for the preparation of a rigid flex circuit board containing prepreg, wherein the rigid flex circuit board is of homogenous construction, i.e. the prepreg therein serves as both the rigid and flex section thereof and wherein the prepreg operates in such novel manner as a consequence of selected prepreg fiber positioning and/or orientation with respect to the conductor patterns or pathways designed thereupon.

More specifically, it is an object of this invention to utilize either the positioning and/or orientation of the fibers in the prepreg with respect to the conductor patterns or pathways or to position the conductor patterns and pathways with respect to the fiber orientation in a manner which uniquely provides for the manufacture a rigid flex circuit board, wherein the flexibility of the flex section can itself be adjusted to a desired or targeted level are a consequence of such novel and alternative positioning techniques.

SUMMARY OF THE INVENTION

A rigid flex printed circuit board wherein the flex section of said board comprises a basestock composite with edges, formed by laminating a conductive layer to a flexible insulator layer said conductor layer containing at least one conductive pathway and said flexible insulator layer comprises fibers dispersed in a matrix polymer. The fibers are oriented with respect to said at least one conductive pathways so that said at least one conductive pathway is substantially non-aligned with said fibers substantially along an entirety of said at least one conductive pathway in said flex section, so as to be flexible.

In method form, the present invention includes a process for preparing a rigid flex printed circuit board comprising first supplying a basestock composite with edges said basestock composite comprising fibers dispersed in a matrix polymer and bonding to said basestock composite a conductive layer followed by imaging and etching a conductive pathway in said conductive layer so that said conductive pathway is substantially non-aligned with said fibers substantially along an entirety of said conductive pathway.

BRIEF DESCRIPTION OF THE DRAWINGS

Various features of the invention will be understood with reference to the figures below and the description thereof, wherein.

DETAILED DESCRIPTION OF THE PREFERRED EMBODIMENTS

In one preferred embodiment, the basic construction technique herein involves the preparation of a rigid flex printed circuit board which comprises a basestock composite with edges formed by laminating a conductive layer to a flexible insulator layer, said flexible insulating layer comprising fibers dispersed in a matrix polymer, said fibers oriented so that said fiber orientation is essentially non-parallel to said edge of the basestock composite. This is followed by the design lay-out of a conductor pattern in non-aligned relationship to said non-parallel fiber orientation substantially along the entirety of said conductor pattern.

More specifically, in a particularly preferred embodiment, the basestock material is fabricated by first using a prepreg material that positions the weave fibers in non-parallel relationship to the edges thereof, wherein said fibers are preferably oriented at about a 45 degree angle to said edge. A copper conductive layer is then bonded to one or both sides of this prepreg to make a composite material that is suitable for imaging and etching using standard printed wiring board techniques.

After the basestock is formed the circuitry image is transferred and formed using photolithography (coat, image, etch, strip) and the layer is the preferably covercoated using an epoxy prepreg, which similar to the basestock, also preferably has the fibers positioned or oriented at a 45 degree angle with respect to the prepreg edge.

Accordingly, the process steps found suitable and most preferred for manufacturing product according to the present invention begins with fabrication of an inner layer(s) using conventional photolithography techniques and can be either single or double planes of copper. For construction consisting of single flex layers, it is preferred not to use a covercoating. For constructions consisting of multiple flex layers, the innerlayer would be covercoated at the layer stage using a prepreg that also has the fibers preferably oriented at a 45 degree angle to the edge thereof.

During final lamination a sheet of prepreg would be used as the covercoat across both the rigid and flexible sections. This prepreg would also have the fibers preferably oriented at a 45 degree angle to the edges thereof instead of the traditional orientation of 90 degrees.

The hardboard innerlayer(s) are also preferably fabricated herein using conventional photolithography techniques. The hardboard layers are those layers that do not traverse across the flexible section by design. Hardboard inner layer(s) can also be either single or double plane of copper. Prior to final lamination, the hardboard layers would be mechanically routed to define the flexible portion by the removal of the material from the intended flex region.

Layers are preferably bonded together in a laminating press where the flexible innerlayer would be sandwiched between hardboard materials to form rigidized and flexible areas. Multiple layers are preferably bonded together using a low flow or no-flow prepreg that has had the material mechanically removed from the intended flexible section allowing those layers to move and flex unencumbered from the other layers.

Following lamination, the substrate is then processed using conventional printed circuit board technology (i.e., drilling, through hole plating, etc.) to create an electrically functional multi-layer circuit board. The protective outer layer is mechanically removed from the flex areas to expose the inner layer's flexible circuitry traces.

The conductive layers of the present invention also preferably comprises about 9 micron to two ounce copper sheet, which is available in the following general form: rolled annealed, high tensile and elongation grade, and electrodeposited. The basestock layer preferably comprises fiberglass sheet impregnated with a thermo set adhesive, such as epoxy, and which is available from Allied Signal Inc.

Those skilled in the art will appreciate that there are several options to the above basic invention. One preferred option is that which is mentioned above where the fibers of both the basestock prepreg and the covercoat prepreg are angled at 45 degrees with respect to the edge thereof. Another preferred option is to only angle the fibers of the covercoat prepreg. Covercoating using fibers that are parallel to the edges thereof has been found to generally fail a single flexing test (see the Institute for Interconnecting and Packaging Electronic Circuits Test Method 650, Number 2.4.3.1 "Flexural Fatigue and Ductility, Flexible Printed Wiring", March 1991. Revision 3). Another preferred option is to fabricate the prepreg using the angled prepreg and then to overcoat the flexible section using a liquid flexible soldermask that is preferably photoimageable.

Figure 1:
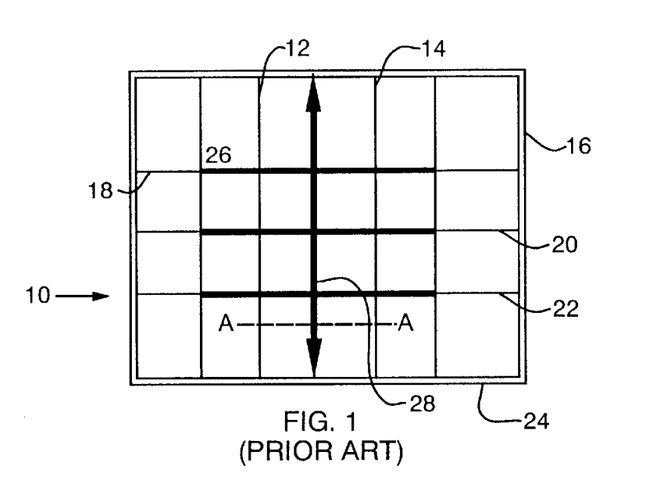
FIG. 1 illustrates the fibers of a prepreg orientated at right angles to an applied stress according to the prior art.

With reference now to the illustrations, shown at 10 in FIG. 1 is a prepreg positioned in a rigid flex circuit according to the teachings of the prior art. Specifically, prepreg fiber bundles 12 and 14 run generally parallel to edge 16 and fiber bundles 18, 20 and 22 are in parallel relationship with edge 24. In addition, conductive pathways are shown in bold at 26 which conductive pathways are aligned substantially along their length as the case may be with fiber bundles 18, 20 and 22.

Accordingly, when a stress is applied by bending or folding the prepreg 10 along bold axis 28, it has been observed that cracking will occur most prominently along fiber lengths 12 and 14. In other words, bending or folding along axis 28, provokes crack propagation that is generally parallel to the bend stress, and along the fibers 12 and 14 which are aligned in such parallel configuration. That being the case, the conductive pathways also are seen to crack, and for the purpose of illustrating cracking of the conductive pathways in better detail, attention is next directed to FIG. 2, which is a perspective view along line A—A' of FIG. 1.

Figure 2:
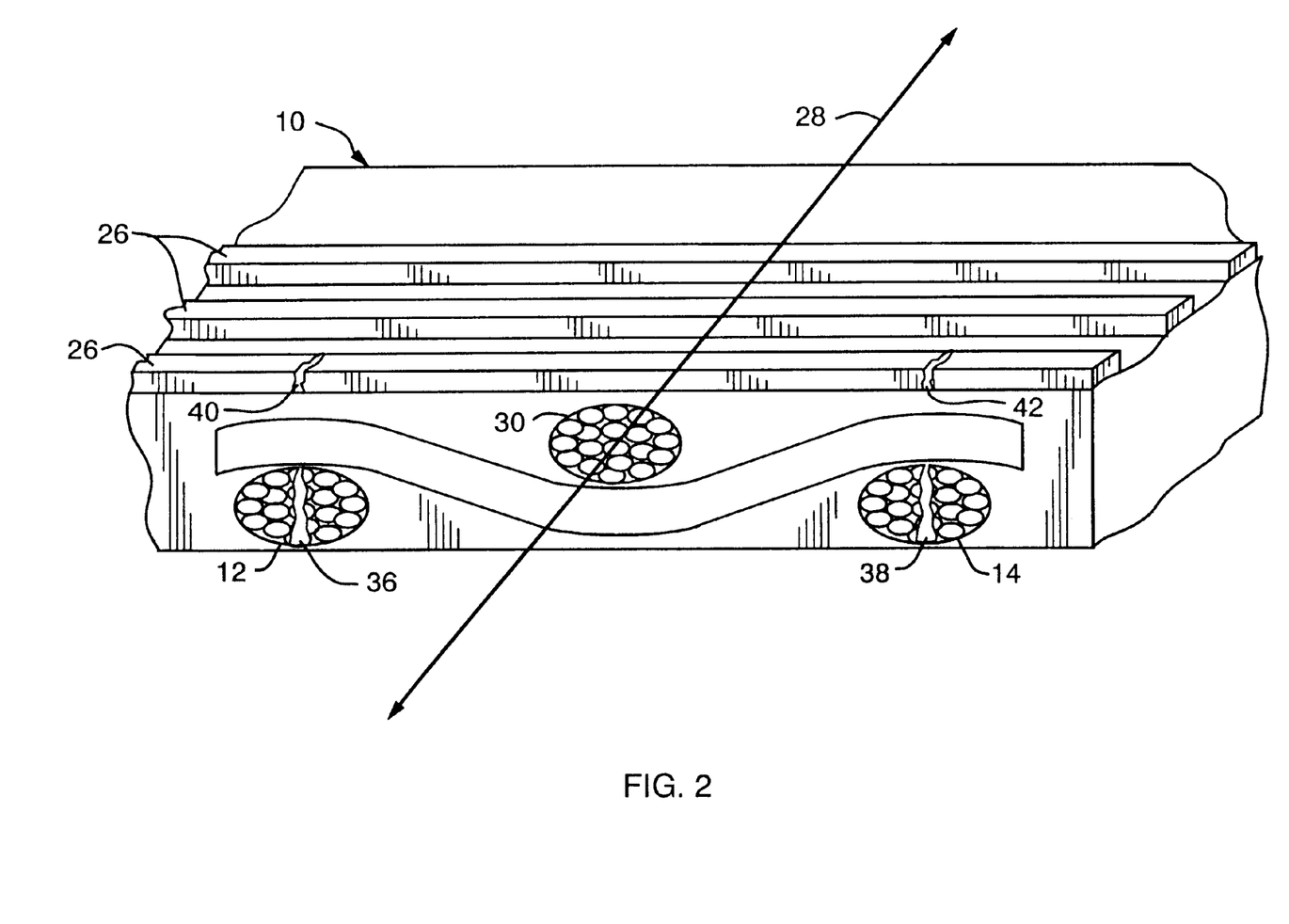
FIG. 2 illustrates the proposed development of cracking in the fiber bundles and in the copper traces when prepreg fibers are positioned in generally parallel relationship to the edge thereof, and is a side-view along line A—A' of FIG. 1.

As can be seen in FIG. 2 the prepreg 10 has on the surface thereof copper traces or pathways 26. At 28 is a line which illustrates the position of mandrel placement. At 12 and 14 the fiber bundles of FIG. 1 are shown in better cross-sectional detail, and at 30 are the fiber bundles which run parallel to the mandrel direction. Accordingly, when the prepreg 10 is placed so that the mandrel is positioned in contact with prepreg 10 along line 28, and flexing upwards and downward about the mandrel is made to occur, cracking is seen most prominently in the fiber bundles at 36 and 38, and the copper traces are also seen to break or deform at corresponding locations 40 and 42, thereby causing discontinuity and associated failure in conductivity.

Figure 3:
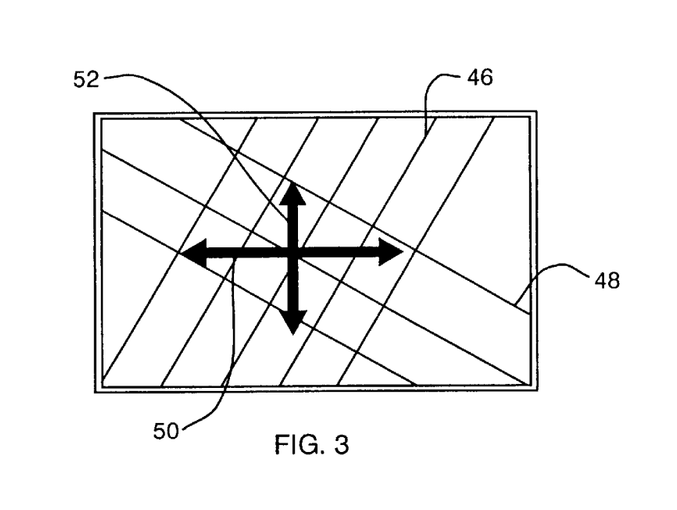
FIG. 3 illustrates in preferred embodiment the orientation of fibers of the flex section of the present invention.

Turning to FIG. 3, as illustrated therein, the fibers 46 and 48 of the prepreg are positioned in non-parallel relationship with the edges of the prepreg. By configuring the fibers in such non-parallel relationship, when a bend or flex is imposed along axis 50 or 52, it can be appreciated that the stresses which are developed do not generally coincide along any one fiber pathway, and increased flexibility is observed.

Without being bound by any particular theory, it is believed that when the fibers are so uniquely positioned, the fibers no longer serve as a coinciding crack propagation pathway, and therefore, flexibility is enhanced. In addition, it is believed that when the fiber bundles are located at the preferred angle of 45 degrees with respect to the conductive pathways, less bundles are stressed when the conductive pathways are stressed, thereby again providing a possible explanation for the observed increase in flexibility demonstrated herein.

The preferred manufacturing method comprises the preparation of a basestock material by using a prepreg, as shown in FIG. 3, wherein the weave fibers are orientated at the preferred 45 degree angle with respect to the edges thereof. However, in a much broader context, the fibers are to be positioned or oriented with respect to an associated conductive pathway so that said pathway is non-aligned with said fiber, substantially along the entirety of said conductive pathway, which therefore provides flexibility to said pathway as noted above. That being the case, any angle of the fibers which satisfies this flexibility criterion falls within the broad scope of this invention, and includes those angles which simply avoids having the fiber and conductive pathways coincide with one another substantially along their length.

In addition, those skilled in the art will recognized that the important consideration is the positioning or orientation of the conductive pathways relative to the fibers of the prepreg that is important. That being the case, one can arrange for basestock with fibers at the preferred non-aligned orientation to the conductive pathways, or one can cause their lay-out design for the conductive pathways to run in non-aligned orientation with respect to the fibers, to achieve the increased flexibility of this invention.

Figure 4:
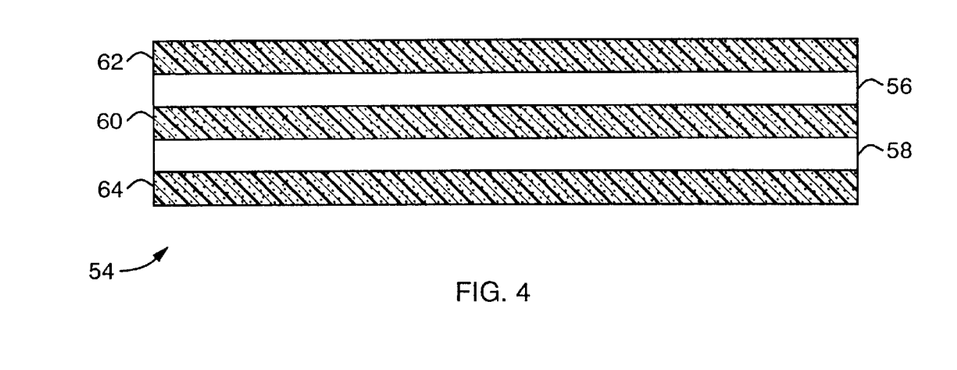
FIG. 4 illustrates a side-view of the angled prepreg which comprises the flex section of an inner layer.

Attention is next directed to FIG. 4, which illustrates at 54 the present invention in a preferred double sided basestock configuration for a flex layer which contains copper foil at 56 and 58 and the epoxy prepreg basestock at 60 with the fibers oriented at the preferred angle of 45 degrees with respect to the conductive pathways thereon. In addition, angled epoxy prepreg also with fibers at the preferred 45 degree angle are shown at coverlayers 62 and 64.

Figure 5:
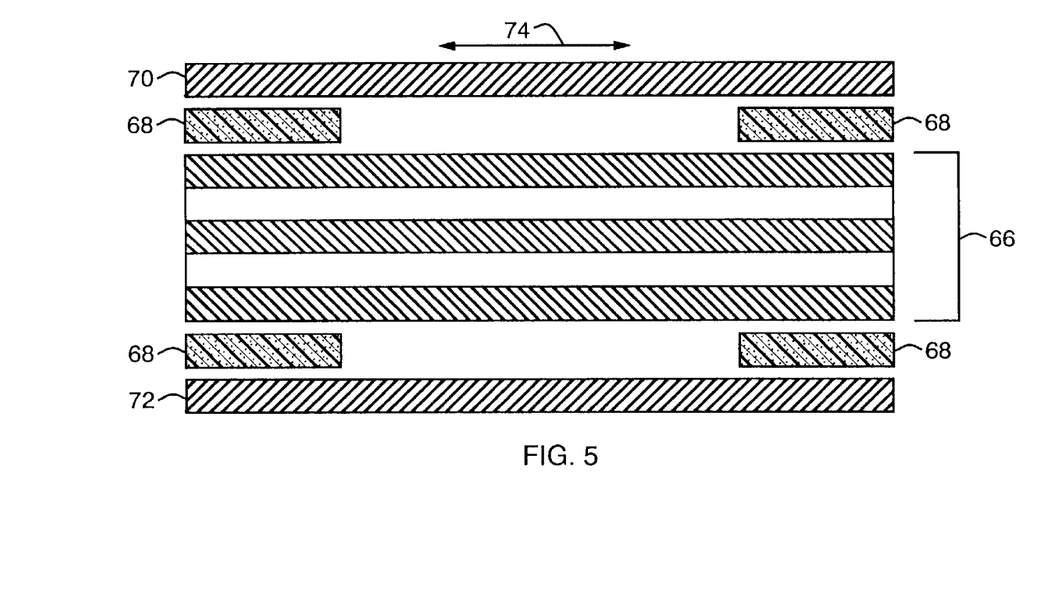
FIG. 5 illustrates a side-view of a basic multilayer rigid flex circuit board.

Illustrated at FIG. 5 is a cross section of a preferred multilayer rigid flex printed circuit of the present invention. Specifically, the flex section of FIG. 4 is shown generally at 66, a low flow epoxy bondfilm is shown at 68, and additional copper foil layers at 70 and 72. At 74 is illustrated the flex section of this multilayer design. As noted above, in this section of the circuit board the copper layer covering the flex area must be removed thereby allowing the flexible section to move and flex unencumbered by the other layers.

Figure 6:
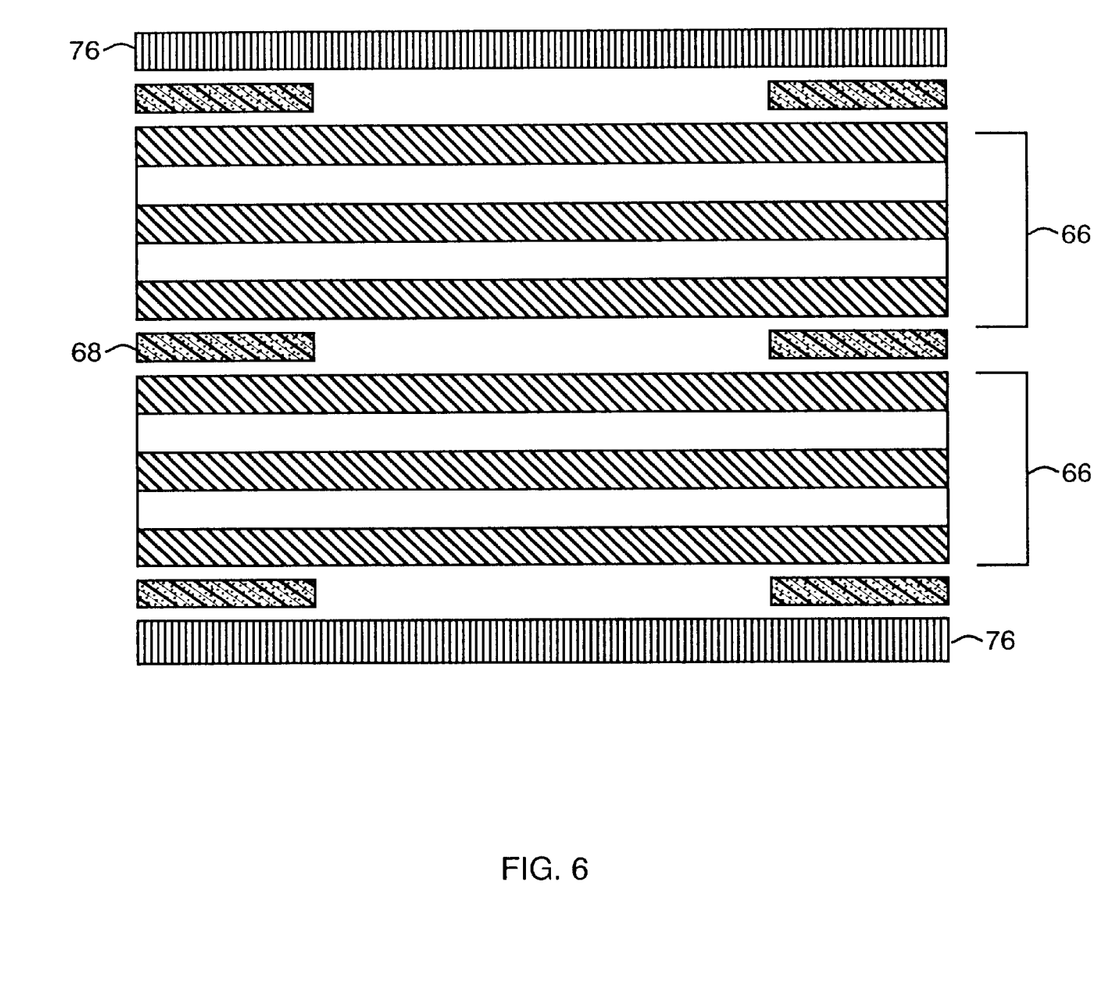
FIG. 6 illustrates a side-view of a multilayer rigid flex with hardboard laminate outerlayers in the rigid areas only.

Illustrated in FIG. 6 is yet another cross section of a multilayer circuit board in accordance with the present invention. Once again, at 66 is the flex section of FIG. 4, a low flow epoxy prepreg bondfilm at 68, and at 76 is the hardboard laminate outerlayer which spans the flexible layer as shown at 78, which layers, as noted above, are removed from the flex sections identified at 78.

In order to further illustrate the invention herein, a series of tests were conducted and compared to prior art designs. In Table I below. "Flex Endurance Testing" is reported, pursuant to IPC-TM-650 Test No. 2.4.3.1 "Flexural Fatigue and Ductility, Flexible Printed Wiring". This particular test measures the flexural fatigue behavior of the conductor metal pathway for any given bend radius. In this test, the number of cycles-to-failure is reported by continuous cycling of a test coupon (with conductive pathways laminated to a basestock composite) about a mandrel of selected size (i.e. diameter). An increase in the number of cycles to failure indicates greater resistance to flexing and increased conductor ductility:

TABLE I

FLEX ENDURANCE TESTING

| Pre-Preg Manufacturer | Thickness | Copper Type & Weight | Mandril Size & Con. Width | 90 Degree Weave Pattern | 45 Degree Weave Pattern |
|---|---|---|---|---|---|
| Allied Signal 1080 PP | .003 in. thk | 1 oz. H.T.E. (superflex) | .125" Dia. | | |
| | | | .025 in. wide | 40 cycles | 154 Cycles |
| | | | .010 in. wide | Etch def. | 111 Cycles |
| | | | .005 in. wide | 72 Cycles | 94 Cycles |
| Allied Signal 1080 PP | .003 in. thk. | 1 oz. H.T.E. (superflex) | .250" Dia. | | |
| | | | .025 in. wide | 276 Cycles | 457 Cycles |
| | | | .010 in. wide | 215 Cycles | 153 Cycles |
| | | | .005 in. wide | 212 Cycles | 256 Cycles |
| Allied Signal 106 PP | .002 in. thk | 1 oz. H.T.E. (superflex) | .125" Dia. | | |
| | | | .025 in. wide | 177 Cycles | 418 Cycles |
| | | | .010 in. wide | 180 Cycles | 354 Cycles |
| | | | .005 in. wide | 113 Cycles | 247 Cycles |
| Allied Signal 106 PP | .002 in. thk | 1 oz. H.T.E. (superflex) | .125" Dia. | | |
| | | | .025 in. wide | 893 Cycles | 2134 Cycles |
| | | | .010 in. wide | 586 Cycles | 1598 Cycles |
| | | | .005 in. wide | etch defect | 823 Cycles |
| Allied Signal 106 PP | .002 in. thk | 1 oz. ED | .125" Dia. | | |
| | | | .025 in. wide | 45 Cycles | 464 Cycles |
| | | | .010 in. wide | 139 Cycles | 317 Cycles |
| | | | .005 in. wide | 113 Cycles | 182 Cycles |
| Allied Signal 106 PP | .002 in. thk | 1 oz. ED | .250" Dia. | | |
| | | | .025 in. wide | 947 Cycles | 3340 Cycles |
| | | | .010 in. wide | 623 Cycles | 1093 Cycles |
| | | | .005 in. wide | 437 Cycles | 711 Cycles |
| Allied Signal 1080 PP | .003 in. thk | 2 oz. H.T.E. | .125" Dia. | | |
| | | | .025 in. wide | 10 Cycles | 173 Cycles |
| | | | .010 in. wide | 58 Cycles | 81 Cycles |
| | | | .005 in. wide | 33 Cycles | 26 Cycles |
| Allied Signal 1080 PP | .003 in. thk | 2 oz. H.T.E. | .250" Dia. | 213 Cycles | |
| | | | .025 in. wide | 165 Cycles | Sheet was |
| | | | .010 in. wide | 137 Cycles | damaged |
| | | | .005 in. wide | | |
| Allied Signal 106 PP | .002 in. thk | 2 oz. H.T.E. | .125" Dia. | | |
| | | | .025 in. wide | 36 Cycles | 405 Cycles |
| | | | .010 in. wide | 85 Cycles | 218 Cycles |
| | | | .005 in. wide | 44 Cycles | 47 Cycles |
| Allied Signal 106 PP | .002 in. thk | 2 oz H.T.E. | .250" Dia. | | |
| | | | .025 in. wide | 595 Cycles | 1164 Cycles |
| | | | .010 in. wide | 367 Cycles | 710 Cycles |
| | | | .005 in. wide | 274 Cycles | 240 Cycles |
| Allied Signal 1080 PP | .003 in. thk | 2 oz. ED | .125" Dia. | | |
| | | | .025 in. wide | 6 Cycles | 65 Cycles |
| | | | .010 in. wide | 19 Cycles | 23 Cycles |
| | | | .005 in. wide | 16 Cycles Damaged | Sample |
| Allied Signal 1080 PP | .003 in. thk | 2 oz ED | .250" Dia. | | |
| | | | .025 in. wide | 78 Cycles | 295 Cycles |
| | | | .010 in. wide | 58 Cycles | Sample |
| | | | .005 in. wide | 38 Cycles | Damaged |
| Allied Signal 106 PP | .002 in. thk | 2 oz. ED | .125" Dia. | | |
| | | | .025 in. wide | | 199 Cycles |
| | | | .010 in. wide | | 104 Cycles |
| | | | .005 in. wide | | 23 Cycles |
| Allied Signal 106 PP | .002 in. thk | 2 oz. ED | .250" Dia. | | |
| | | | .025 in. wide | 209 Cycles | 682 Cycles |
| | | | .010 in. wide | 151 Cycles | 319 Cycles |
| | | | .005 in. wide | 65 Cycles | 63 Cycles |

PP = prepreg.
H.T.E. = high tensile and elongation
E.D. = electro-deposited
Two different mandrel sizes are noted, 0.125 and 0.250 inch diameter.
All tests were run on a Universal Mfg. Co. Ductility Flex Tester, and the flex angle achieved is approximately 135 degrees.
Conductor width is the width of the conductive pathways on a single-sided test coupon. No covercoats were employed for this data.

As can be seen from the above, a significant improvement in flexural characteristics are observed when the weave pattern is oriented at the preferred 45 degrees (conductive pathways non-aligned with the fibers of the prepreg) as opposed to the prior art 90 degree configuration (conductive pathway aligned with the fibers of the prepreg). That is, the number of cycles to failure increases in rather dramatic fashion.

A second set of samples were manufactured, and these were double sided circuits. However, in these samples, the effect of a covercoat was also considered. That is, the covercoat was positioned so that the fibers of the covercoat were either at the preferred angle of 45 decrees (non-aligned relationship to conductive pathways) or at a 90 degree or aligned relationship therewith. Furthermore, in this second set of samples, the test performed was "flex to install" which is a harsher test than the flex testing shown in Table I. That is, in "flex to install" the samples are subjected to a full 180 degree bend in two directions, using different mandrel sizes starting with 0.125 inches through 0.250 inches. Listed below are the results of this testing:

As can be seen from Table II, the prior art design of a 90 degree basestock and 90 degree covercoat on a 1 oz. rolled annealed copper foil, in the case of a 0.25 inch diameter mandrel, indicated sample fracture on the very first bend. When the covercoat fibers are then positioned at 45 degrees (i.e., in non-aligned relationship with the conductive pathways) the sample proceeds through 26 cycles without failure.

Finally, in Table III below, yet another set of double sided basestock (90 and 45 degrees) was manufactured from the Allied Signal 106 and 1080 prepreg. This time, however, a Kapton®/Acrylic was used at the covercoat instead of prepreg. The results of this test on both flex endurance and flex to install on a 0.125 inch mandrel appear below in Table III:

TABLE II

FLEX TO INSTALL TESTING

| Mfg., Copper Glass & Direction | .250" Dia. Mandril .025 in. wide cond. | .187" Dia. Mandril .025 in. wide cond. | .125" Dia. Mandril .025 in. wide cond. |
|---|---|---|---|
| Allied Signal, 1 oz. RA, 1080PP 90 Base & 90 C/C | 0 Cycles Sample fractured during 1st bend | Not Applicable | Not Applicable |
| Allied Signal, 1 oz. RA, 1080PP 90 Base & 45 C/C | 26 Cycles No Failure - PP show signs of stress. | 6 cycles to Failure - PP show signs of stress after 2 Cycles. | Not Applicable |
| Allied Signal, 1 oz. RA, 1080PP 45 Base & 90 C/C | 0 Cycles Sample fractured during 1st bend | Not Applicable | Not Applicable |
| Allied Signal, 1 oz. RA, 1080PP 45 base & 45 C/C | 26 Cycles No Failure - PP show signs of stress | 15 Cycles to Failure PP show signs of stress after 5 Cycles. | Not Applicable |
| Allied Signal, 1 oz RA, 1 06 PP 90 Base & 90 C/C | 26 Cycles, No failure Stress cracks after 15 Cycles. | 4 Cycles to Failure Stress cracks after 2 Cycles | Not Applicable |
| Allied Signal, 1 oz. RA, 106 PP 90 Base & 45 C/C | 26 Cycles No Failure Sample Clean | 26 Cycles No Failure Sample Clean | 26 Cycles No Failure Stress cracks appear |
| Allied Signal, 1 oz. RA, 106 PP 45 Base & 90 C/C | 26 cycles No Failure Sample Clean | 26 Cycles - No failure Stress cracks after 5 Cycles | Not applicable |
| Allied Signal, 1 oz. RA, 106 PP 45 Base & 45 C/C | 26 Cycles No Failure | 26 Cycles No Failure | 26 Cycles No Failure Stress cracks appear |

RA = rolled annealed
C/C = covercoat
PP = prepreg

TABLE III

| Mfg. | Flex to Install Conductor Width - C.T.F. | Flex Endurance Conductor Width - C.T.F. |
|---|---|---|
| Allied Signal 1080 PP @90 1 oz RA, double sided Rogers 110 C/C | .025 in. wide 78 Cycles .010 in. wide 71 Cycles .005 in. wide Etch defect | .025 in. wide 229 Cycles .010 in. wide 248 Cycles .005 in. wide 194 Cycles |
| Allied Signal 1080 PP @45 1 oz. RA, double sided Rogers 110 C/C | .025 in. wide 179 Cycles .010 in. wide 158 Cycles .005 in. wide 165 Cycles | .025 in. wide 337 Cycles .010 in. wide 280 Cycles .005 in. wide 263 Cycles |
| Allied Signal 106 PP @90 1 oz. RA, double sided Rogers 110 C/C | .025 in. wide 281 Cycles .010 in. wide 285 Cycles .005 in. wide 278 Cycles | .025 in. wide 443 Cycles .010 in. wide 499 Cycles .005 in. wide 403 Cycles |
| Allied Signal 106 PP @45 1 oz. RA, double sided Rogers 110 C/C | .025 in. wide 330 Cycles .010 in. wide 358 Cycles .005 in. wide etch defect | .025 in. wide 576 Cycles .010 in. wide 459 Cycles .005 in. wide etch defect |

CTF = cycles to failure
Rogers 110 C/C = Kapton ® polymer covercoat available from Rogers Corporation As can be seen from Table III, once again, when the fibers of the basestock prepreg are positioned in generally aligned or coinciding relationship with the conductive pathways, the number of cycles to failure in either the flex to install or flexural endurance test is at a minimum. By comparison, when the fibers of the basestock prepreg are positioned in substantially non-aligned relationship with the conductive pathways (the preferred angle of 45 degrees as shown in FIG. 3) a rather dramatic increase in the number of cycles to failure in either test is observed.

In addition, and with reference again to Table III, it will also be appreciated to those skilled in the art that in lieu of the polyimde or Kapton® brand covercoat employed in the flex section, a flexible photoimageable solder mask can be employed.

We claim:

1. A rigid flex printed circuit board wherein the flex section of said board comprises a basestock composite with edges, formed by laminating a conductive layer to a flexible insulator layer, said conductor layer containing at least one conductive pathway and said flexible insulator layer comprises woven fibers dispersed in a matrix polymer, said woven fibers oriented with respect to said at least one conductive pathway so that said at least one conductive pathway is non-aligned with said woven fibers, substantially along an entirety of said at least one conductive pathway in said flex section, so as to be flexible.

2. The rigid flex printed circuit board of claim 1 wherein said woven fiber orientation is non-aligned to said edge of said basestock composite.

3. The rigid flex printed circuit board of claim 1 wherein said fiber orientation is about 45 degrees relative to one of said edges.

4. The rigid flex printed circuit board of claim 1, wherein said conductive layer comprises a thickness of about 9 micron to 1 micron copper sheet and said flexible insulator layer comprises fiberglass impregnated with a thermoset adhesive.

5. The rigid flex printed circuit of claim 4, wherein said thermoset adhesive is an epoxy resin.

6. The rigid flex printed circuit board of claim 1, wherein said at least one conductive pathway is formed by imaging and etching.

7. The rigid flex printed circuit board of claim 1, wherein said rigid flex circuit board has a greater number of cycles to failure in the flex section as measured by IPC-TM-650, over that of a comparison flex section, said comparison flex section formed by laminating a conductive layer to a flexible insulator layer containing a conductive pathway, and said flexible insulating layer comprising fibers dispersed in a matrix polymer, said fibers oriented with respect to said conductive pathway so that said conductive pathway is substantially aligned with said fibers substantially along an entirety of said conductive pathway in said comparison flex section.

8. The rigid flex printed circuit board of claim 1, wherein said flex section includes a flexible insulating covercoat selected from the group consisting of polyimide polymers, or flexible photoimageable solder masks.

9. The rigid flex printed circuit board of claim 1, wherein said flex section includes a covercoat, said covercoat containing fibers dispersed in a matrix polymer, wherein said fibers in said covercoat are oriented with respect to said at least one conductive pathway so that said at least one conductive pathway is substantially aligned with said fibers of the covercoat.

10. The rigid flex printed circuit board of claim 9 wherein said fiber orientation of said covercoat is non-aligned with respect to said edge of said covercoat.

11. The rigid flex printed circuit board of claim 8 wherein said fiber orientation is about 45 degrees relative to one of said edges.

12. The rigid flex printed circuit board of claim 9 wherein the woven fibers of the basestock are oriented with respect to said at least one conductive pathway so that said at least one conductive pathway is non-aligned with said woven fibers of said basestock substantially along an entirety of said at least one conductive pathway in said flex section.

13. The rigid flex printed circuit board of claim 9, wherein said rigid flex circuit hoard has a greater number of cycles to failure in the flex section as measured by IPC-TM-650, over that of a comparison flex section of a printed circuit board containing a conductive pathway, said comparison flex section containing a covercoat layer comprising fibers dispersed in a matrix polymer, wherein the fibers of the matrix polymer are substantially aligned along an entirety of said conductive pathway in said comparison flex section.

14. A rigid flex printed circuit board wherein the flex section of the board comprises a basestock composite, formed by laminating a conductive layer to an insulating layer comprising woven fibers dispersed in a matrix polymer, said conductive layer containing at least one conductive pathway, said flex section further containing a covercoat layer with edges, said covercoat layer comprising fibers dispersed in a matrix polymer, wherein the fibers of said covercoat layer are oriented with respect to said at least one conductive pathway so that said at least one conductive pathway is non-aligned with said fibers of the covercoat substantially along an entirety of said at least one conductive pathway in said flex section, so as to be flexible.

* * * * *

UNITED STATES PATENT AND TRADEMARK OFFICE
CERTIFICATE OF CORRECTION

PATENT NO.   : 5,997,983
DATED        : December 7, 1999
INVENTOR(S)  : A. Roland Caron et al.

Page 1 of 1

It is certified that error appears in the above-identified patent and that said Letters Patent is hereby corrected as shown below:

Column 13,
Line 37, "a thickness of" should be removed
Line 38, "1 micron" should be -- 2 ounce --

Column 14,
Line 29, "hoard" should be -- board --

Signed and Sealed this

Twentieth Day of August, 2002

Attest:

Attesting Officer

JAMES E. ROGAN
Director of the United States Patent and Trademark Office